United States Patent [19]
Apfel

[11] Patent Number: 5,986,290
[45] Date of Patent: Nov. 16, 1999

[54] SILICON CONTROLLED RECTIFIER WITH REDUCED SUBSTRATE CURRENT

[75] Inventor: Russell J. Apfel, Austin, Tex.

[73] Assignee: Advanced Micro Devices, Inc., Sunnyvale, Calif.

[21] Appl. No.: 08/994,481

[22] Filed: Dec. 19, 1997

[51] Int. Cl.[6] .................................................. H01L 29/74
[52] U.S. Cl. ...................... 257/154; 257/175; 257/176; 257/162; 327/438; 327/439; 327/440
[58] Field of Search .................................. 257/154, 175, 257/176, 162; 327/438, 439, 440

[56] References Cited

U.S. PATENT DOCUMENTS

| | | | |
|---|---|---|---|
| 3,660,687 | 5/1972 | Sahm | 327/439 |
| 4,567,500 | 1/1986 | Avery | 327/438 |
| 4,631,567 | 12/1986 | Kokado | 257/154 |
| 4,924,341 | 5/1990 | Culp | 327/438 |

FOREIGN PATENT DOCUMENTS 55-23684  2/1980  Japan .

*Primary Examiner*—Jerome Jackson, Jr.
*Attorney, Agent, or Firm*—Foley & Lardner

[57] ABSTRACT

The invention provides a silicon controlled rectifier having an anode and a cathode and including an NPN transistor and a PNP transistor. The NPN transistor has an emitter coupled to the cathode, a base and a collector. The PNP transistor has a base coupled to the NPN collector, an emitter coupled to the anode, a first collector coupled to the NPN base and a second collector coupled to the NPN collector.

15 Claims, 2 Drawing Sheets

SILICON CONTROLLED RECTIFIER WITH REDUCED SUBSTRATE CURRENT

BACKGROUND OF THE INVENTION

1. Field of the Invention

The invention relates generally to semiconductor switching devices and in particular to an improved reverse blocking triode thyristor, commonly known as a silicon controlled rectifier or SCR. The invention provides a new SCR with improved operational characteristics.

2. Related Art

Thyristors are solid state switches which may be triggered from an open circuit or high impedance state to a short circuit or low impedance state. A thyristor has four electrical control terminals, including an anode gate, a cathode gate, an anode and a cathode. In practice, typically only one of the gates is used with the anode and the cathode. When a thyristor is fabricated as part of an integrated circuit, the thyristor may include a fifth electrical terminal, the substrate. Prior to triggering, a thyristor acts as an open circuit, capable of withstanding a specified, rated voltage applied across the anode and cathode. After triggering, a thyristor provides a low-impedance current path between the anode and cathode and remains in that condition until the current flow stops or is reduced below a predetermined threshold level called the holding current. The magnitude of the holding current may be adjusted using additional circuit elements external to the thyristor. Triggering occurs by supplying current to the gate. Once the thyristor is triggered, the gate current may be removed and the thyristor will remain triggered.

"Thyristor" is a generic term which includes different specific types of devices. One type of thyristor is a reverse blocking triode thyristor, commonly called a silicon controlled rectifier or SCR. An SCR is a unidirectional device, conducting load current in only one direction. Another type of thyristor is a bidirectional triode thyristor, commonly known as a triac. A triac is a bidirectional device, conducting current in either direction in response to the gating or trigger current.

Structurally, a thyristor consists of several alternating layers or regions of doped semiconductor material forming multiple p-n junctions. For example, a thyristor is commonly made of silicon which has been doped n-type or p-type. A load is coupled to the anode and cathode, across the multiple junctions. The trigger current is applied to one of the junctions. The trigger current allows the load current to flow through the device, setting up a regenerative action which keeps the current flowing, even after the trigger current is removed.

For analysis and characterization, the thyristor is modelled as two bipolar transistors. In the model, a PNP transistor has its emitter coupled to the anode and an NPN transistor has its emitter coupled to the cathode. The base of the PNP transistor is modelled as being coupled to the collector of the NPN transistor, and the collector of the PNP transistor is modelled as being coupled to the base of the NPN transistor. However, the n-type region which forms the PNP base is the same n-type region which forms the NPN collector. Similarly, the p-type region which forms the NPN collector is the same p-type region which forms the NPN base. Modelling the thyristor as two transistors allows simpler analysis of the device.

Many thyristors, including SCRs, are used as discrete devices with gate (either anode gate or cathode gate), anode and cathode terminals in electrical contact with their respective p-type or n-type regions. In theory, both gates of the SCR may be used, but in practice, usually only one gate is used for controlling the SCR operation. The terminals may be electrically wired with other system components. Such thyristors are made by forming individual layers on the surface of a semiconductor wafer and doping the respective layers accordingly. Current flow in such thyristors essentially vertical, from layer to layer between the anode and cathode.

Other thyristors are made for use in an integrated circuit in conjunction with active and passive devices formed on the surface of the same semiconductor wafer. Such integrated circuits implement digital or analog functions, or both. The manufacturing process for producing such integrated circuits is typically optimized for production of NPN transistors. NPN transistors produced according to the process have well-controlled, nearly ideal operational parameters. Other devices have parameters which vary greatly from the ideal or which display a wide tolerance.

In many integrated circuit fabrication processes, PNP transistors display less than ideal operational characteristics. For example, in a lateral PNP transistor, the width of the base region is defined by the spacing of the p-type regions which form the collector and emitter of the transistor. This spacing is set by photolithographic considerations, and is much greater than the base width of a vertically oriented NPN transistor, which is set by diffusion or implant of the n+ emitter region into the p-type base. Base width is a key characteristic for a bipolar transistor. The common emitter current gain, or $\beta$, of the transistor is a strong function of base width. PNP transistors, including lateral PNP transistors, suffer from other operational limitations.

One known operational limitation associated with lateral PNP transistors is injection of current into the semiconductor substrate on which the transistor is fabricated. The substrate has a relatively high resistivity and is commonly electrically tied to the most negative potential in the circuit. Typically, the PNP transistor is surrounded with an isolation region doped p-type. The isolation region is electrically coupled to the most negative potential in the circuit to reverse bias the p-n diode formed between the p-type isolation region and adjacent n-type regions. The isolation region thereby electrically isolates the PNP transistor from the surrounding circuit. However, the isolation region operates as an additional, parasitic, collector for the PNP transistor, collecting charge emitted from the emitter and injecting that charge into the substrate.

Injection of current into the substrate is problematical for several reasons. A large portion of the PNP transistor emitter current is diverted from the true collector to the parasitic collector. As much as seventy percent of emitter current is lost into the substrate. Injection of charge into the substrate, combined with the relativity high resistivity of the substrate, may cause the potential of portions of the substrate to deviate substantially from the most negative potential in the circuit. This could cause the normally reverse biased isolation junctions to become forward biased, injecting further current into the substrate, further raising the potential of the substrate. This may result in an uncontrollable condition similar to latch up and may cause permanent destruction of the device.

Another problem created by injection of current into the substrate is diversion of this current from the circuit. If the cathode current of a thyristor is only, say, thirty percent of the anode current because the other seventy percent is substrate current, operation of the circuit which includes the thyristor may be affected. The current may be used to set other voltage levels or to trigger other devices which will not operate properly at the reduced current level.

Moreover, the magnitude of the substrate current is difficult to predict, control or compensate. Substrate current is strongly dependent on operating temperature of the circuit, which may vary widely under differing conditions. Also, substrate current is strongly dependent on manufacturing process parameters, which may vary greatly from circuit to circuit.

SUMMARY AND OBJECTS OF THE INVENTION

In view of the high levels of substrate current and other operational effects in conventional thyristors, it is an object of the invention to provide a thyristor which reduces the level of current injected into the substrate.

It is another object of the invention to provide a thyristor which may be integrated with other digital and analog circuitry on a monolithic silicon substrate using standard manufacturing processes.

It is a still further object of the invention to provide a thyristor in which the holding current necessary to keep the thyristor turned on in a low resistance state is variable by adjusting geometric dimensions of the components of the thyristor.

These and other objects of the invention are provided by a silicon controlled rectifier having an NPN transistor and a PNP transistor. The PNP transistor has a first collector which is commonly formed with the base of the NPN region. The PNP transistor has a second collector which is formed from the isolation region surrounding the silicon controlled rectifier. To limit saturation and injection of carriers into the substrate, the second collector is electrically coupled to the base of the PNP transistor.

BRIEF DESCRIPTION OF THE DRAWINGS

The invention will be described in particularity with reference to the drawings, in which.

For purposes of clarity and ease in understanding the invention, like elements will be identified by like reference numerals in the various drawings.

DETAILED DESCRIPTION OF THE PREFERRED EMBODIMENTS

Figure 1:
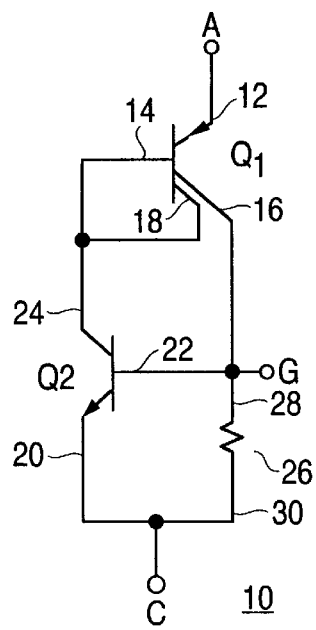
FIG. 1 illustrates a silicon controlled rectifier according to the invention.

FIG. 1 is a schematic diagram of a silicon controlled rectifier 10. The silicon controlled rectifier 10 has an anode terminal A, a cathode terminal C and a gate terminal G. The silicon controlled rectifier 10 includes a PNP transistor Q1 and an NPN transistor Q2. PNP transistor Q1 has an emitter 12 coupled to the anode A, a base 14, a first collector 16 coupled to the gate G and a second collector 18. NPN transistor Q2 has an emitter 20 coupled to the cathode C, a base 22 coupled to the gate G and a collector 24. The silicon controlled rectifier 10 may also include a resistor 26.

PNP transistor Q1 and NPN transistor Q2 are interconnected to form silicon controlled rectifier 10. The base 14 of PNP transistor Q1 is electrically coupled to the collector 24 of NPN transistor Q2. The first collector 16 of PNP transistor Q1 is electrically coupled to the base 22 of NPN transistor Q2. The resistor 26 has a first end 28 coupled to the gate G and a second end 30 coupled to the cathode C. Preferably, the second collector 18 of PNP transistor Q1 is coupled directly to the base 14 of PNP transistor Q1.

In a preferred embodiment, the silicon controlled rectifier 10 is fabricated as a monolithic semiconductor integrated circuit. For example, the silicon controlled rectifier 10 may be fabricated on a silicon integrated circuit (not shown) with the anode A, gate G and cathode C electrically coupled to other components of the integrated circuit. The integrated circuit is fabricated on a semiconductor substrate using masking, photolithography, diffusion, ion implantation and other processes well-known in the art. Alternatively, the silicon controlled rectifier 10 could be manufactured from other semiconductor material, such as gallium arsenide, or may be manufactured from discrete elements.

In its actual embodiment, the regions of semiconductor material which form the collector, base and emitter of PNP transistor Q1 and NPN transistor Q2, respectively, may be combined. For example, the p-type semiconductor region which forms the first collector 16 of PNP transistor Q1 may be the same p-type semiconductor region which forms the base 22 of NPN transistor Q2. Similarly, the n-type region which forms the base 14 of PNP transistor Q1 may be the same n-type region which forms the collector 2!4 of NPN transistor Q2. Combining regions which are electrically coupled is desirable when manufacturing an integrated circuit to reduce the surface area of the integrated circuit required by the silicon controlled rectifier 10. Reducing surface area is important for improving manufacturability of the integrated circuit including the silicon controlled rectifier 10. Reducing surface area is also important for reducing junction capacitances associated with each node of the silicon controlled rectifier 10 and thereby improving the switching performance of the silicon controlled rectifier 10.

In accordance with the invention, the second collector 18 of PNP transistor Q1 is coupled directly to the base 14 of PNP transistor Q1. Tying the collector of a transistor such as PNP transistor Q1 to the base of the transistor limits saturation of the transistor.

Saturation occurs when the collector-base junction of the transistor becomes forward biased. In saturation, large amounts of current are injected into the semiconductor substrate, which is typically doped p-type and electrically coupled to the most negative potential in the circuit. Current injected into the substrate may forward bias the normally reverse biased diode which electrically isolates devices such as PNP transistor Q1 and NPN transistor Q1 from the substrate. Moreover, current injected into the substrate is not conducted through the NPN transistor Q2, which may limit the regenerative effects which keeps the silicon controlled rectifier 10 latched in its low resistance, on state, causing operational errors. Still further, current injected into the substrate is not available for supply to components of the integrated circuit which may be coupled to the cathode C.

Tying the second collector 18 to the base 14 of PNP transistor Q1 reduces the current injected into the substrate. For example, the inventor has found that, in a conventional silicon controlled rectifier which included a PNP transistor which lacked a second collector tied to its base, 1 mA of anode current at the anode A was reduced to 300 µA of cathode current at the cathode C, with 700 µA injected into the substrate. In contrast, in a silicon controlled rectifier such as silicon controlled rectifier 10 including PNP transistor Q1 with second collector 18 coupled to base 14, the cathode current was substantially equal to the anode current. The current injected into the substrate was substantially eliminated.

Other techniques for eliminating saturation of transistors may also be used in place of coupling collector 18 to base 14 of PNP transistor Q1. For example, a P-N diode may be coupled in parallel with the collector-base junction of PNP transistor Q1. Also, for example, a Schottky diode may be formed at the collector-base junction of PNP transistor Q1. Such devices aid in keeping the collector-base junction from becoming fully forward biased.

Resistor 26 may be included with silicon controlled rectifier 10 in order to reduce or eliminate false triggering of the silicon controlled rectifier 10. This shunt resistance improves dynamic performance of the silicon controlled rectifier 10, particularly at high temperatures. Without the shunt, leakage current could be sufficient to turn on the base-emitter junction of the NPN transistor Q2, triggering the silicon controlled rectifier 10. Other dynamic effects, such as fast switching voltage at the anode A, may also cause false triggering and may be reduced by addition of resistor 26.

Silicon controlled rectifier 10 may also include a resistor (not shown in FIG. 1) between the base 14 of PNP transistor Q1 and the anode A. Such a resistor allows adjustment of the holding current, the anode current below which turn off occurs. By varying the resistance of such a resistor, the holding current may be varied. Elimination of this additional resistor is desirable since such a resistor requires additional integrated circuit surface area. The silicon controlled rectifier 10 according to the invention allows elimination of such a resistor and adjustment of holding current level by other means, to be discussed below in conjunction with FIGS. 3–4.

Figure 2A:
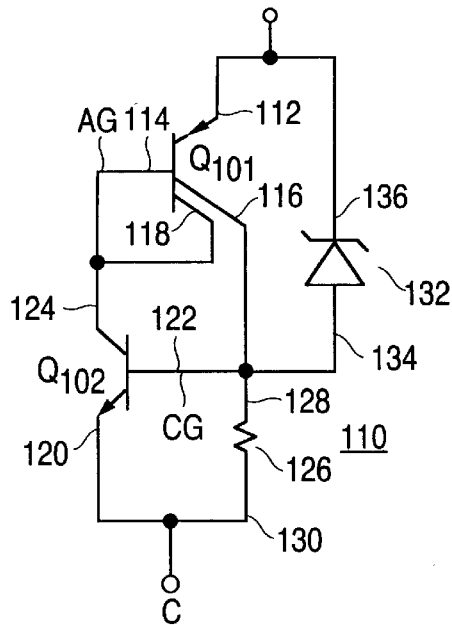
FIGS. 2A–2C illustrate three alternate configurations of the silicon controlled rectifier of FIG. 1 in a circuit which allows triggering in a manner different from the silicon controlled rectifier of FIG. 1.

FIG. 2A illustrates the silicon controlled rectifier of FIG. 1 in a circuit which allows triggering in a manner different from the silicon controlled rectifier of FIG. 1. In FIG. 2A, the silicon controlled rectifier 110 has an anode terminal A and a cathode terminal C. The silicon controlled rectifier 110 includes a PNP transistor Q101 and an NPN transistor Q102. PNP transistor Q101 has an emitter 112 coupled to the anode A, a base 114, a first collector 116 coupled to the gate G and a second collector 118. NPN transistor Q102 has an emitter 120 coupled to the cathode C, a base 122 coupled to the gate G and a collector 124. The silicon controlled rectifier 110 may also include a resistor 126 and a zener diode 132. The base 114 of Q101 corresponds to an anode gate (AG) of the rectifier 110, and the base of Q102 corresponds to a cathode gate (CG) of rectifier 110.

PNP transistor Q1O1 and NPN transistor Q102 are interconnected to form silicon controlled rectifier 110. The base 114 of PNP transistor Q101 is electrically coupled to the collector 124 of NPN transistor Q102. The collector 116 of PNP transistor Q101 is electrically coupled to the base 122 of NPN transistor Q102. The resistor 126 has a first end 128 coupled to the gate G and a second end 130 coupled to the cathode C. The zener diode 132 has an anode 134 coupled to the base 122 of NPN transistor Q102 and the first collector 116 of PNP transistor Q101. The zener diode 132 also has a cathode 136 coupled to the anode A of the silicon controlled rectifier 110.

The zener diode 132 is provided for triggering the silicon controlled rectifier 110. The zener diode 132 is characterized by a zener breakdown voltage, such as 6 volts. At applied reverse bias voltages below the zener breakdown voltage, the zener diode 132 blocks flow of current from the anode A to the base 122 of NPN transistor Q102. At applied voltages greater than the zener breakdown voltage, the zener diode 132 enters reverse breakdown and supplies current to the base 122 of the NPN transistor Q102 from the anode A. When the voltage applied across the anode A and cathode C exceeds the sum of the zener breakdown voltage of the zener diode 132 and the on voltage of the base-emitter junction of NPN transistor Q102, the zener diode 132 will enter reverse breakdown, supplying trigger current to the base 122 of NPN transistor Q102. In response to this trigger current, the silicon controlled rectifier 110 will trigger from its high impedance off state to its low impedance on state.

Inclusion of the zener diode 132 allows the silicon controlled rectifier 110 to be triggered without supply of an additional control signal to a gate terminal, such a gate terminal G of the silicon controlled rectifier 10 illustrated in FIG. 1. This provides additional operational convenience in triggering the silicon controlled rectifier 110. Also, this eliminates the need to connect a gate terminal to a circuit which provides the gate signal, further reducing the surface area of the integrated circuit containing the silicon controlled rectifier 110.

Figure 2B:
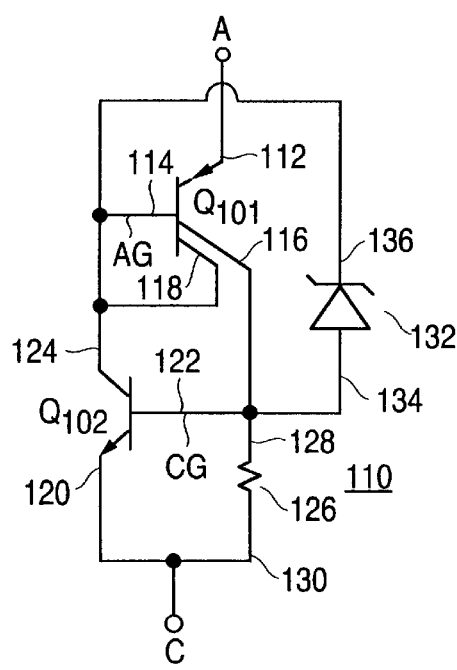
Figure 2C:
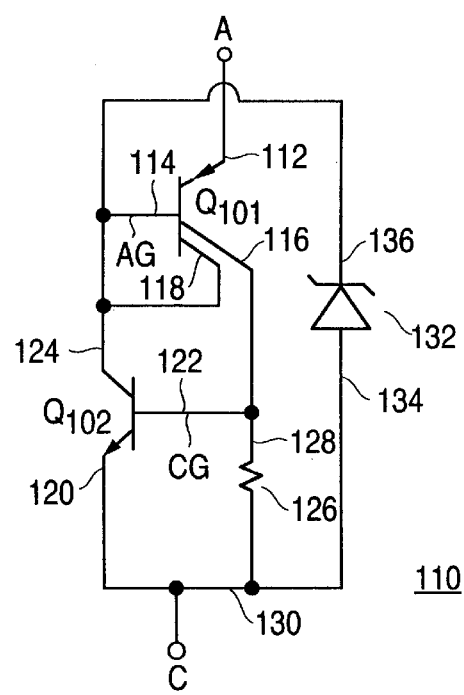

FIGS. 2B and 2C show alternate configurations that perform a substantially similar function to that shown in FIG. 2A. In FIG. 2B, the zener diode 132 is connected between the cathode gate (CG) and the anode gate (AG), and in FIG. 2C, the zener diode 132 is connected between the cathode (node C) and the anode gate (AG).

Figure 3:
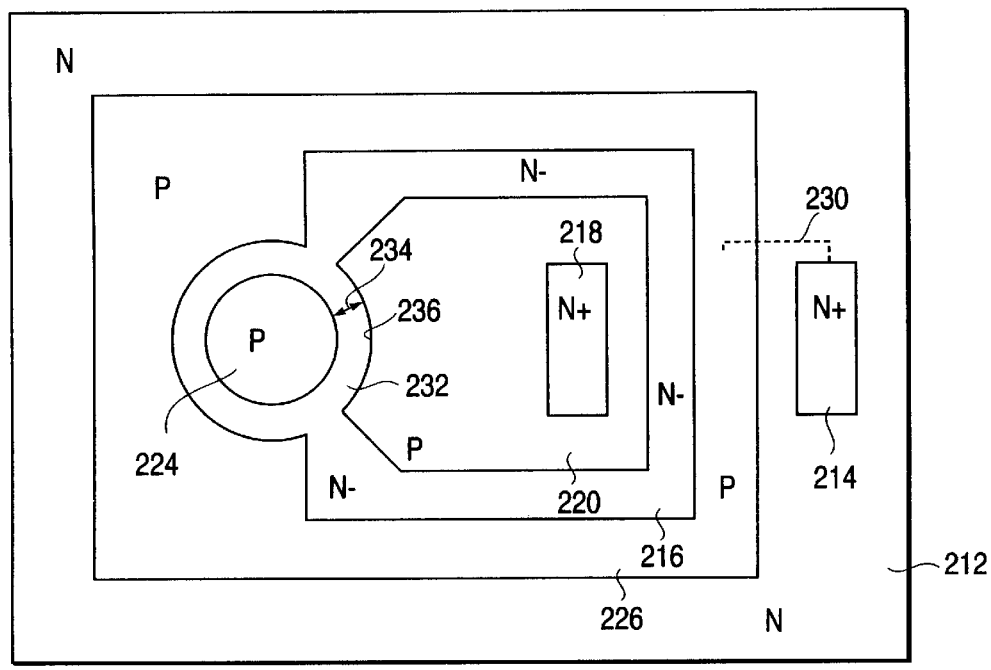
FIG. 3 illustrates a first topology for manufacturing the silicon controlled rectifier of FIG. 1.

FIG. 3 illustrates a first topology 210 for manufacturing the silicon controlled rectifier 10 of FIG. 1. The topology 210 may be a portion of an integrated circuit fabricated on a semiconductor substrate, such as silicon, using fabrication techniques known in the art.

The topology 210 includes first n-type region or layer 212. The first n-type region 212 is fabricated by introducing n-type dopant into the semiconductor substrate (not shown in FIG. 3) using masking, ion implantation, diffusion, and other semiconductor fabrication techniques known in the art. Alternatively, the layers which form the topology 210 could be formed in a layer of epitaxial silicon or other semiconductor formed on the semiconductor substrate. A buried layer of n+ material (not shown) may also be formed on the semiconductor substrate below the elements of the topology 210 illustrated in FIG. 3.

An n+ region 214 is formed in the first n-type region 212. The n+ region 214 is formed by increasing the doping concentration in that region to allow formation of a conducting contact with a subsequently formed conducting layer. A second n-type region 216, doped n–, is also formed in the n-type region 212. A second n+ region 218 is also formed.

The topology 210 further includes a first p-type region or layer 220. The first p-type region 220 is formed by introducing p-type dopant into the semiconductor substrate or epitaxial layer. A second p-type region 224 and a third p-type region 226 are also formed. The third p-type region 226 forms an isolation region for electrically isolating the components within the region 226 from components outside the region 226.

In a standard manufacturing process flow for a bipolar integrated circuit, the first n-type region 212 and the second n-type region 216 may correspond to an NPN collector region; the n+ region 214 may correspond to a deep collector or collector post region; the first, second and third p-type regions 220, 224, 226 may correspond to an NPN base region; the p region 224 may correspond to a base contact region; and the n+ region 218 may correspond to an emitter region.

The individual regions of the topology 210 define elements of a silicon controlled rectifier analogous to silicon controlled rectifier 10 (FIG. 1). The second p-type region 224 is analogous to the emitter 12 of the PNP transistor Q1 coupled to the anode A. The n-type region 216 is analogous to the base 14 of the PNP transistor Q1 and the collector 24 of NPN transistor Q2. The p-type region 220 is analogous to the first collector 16 of PNP transistor Q1 and the base 22 of NPN transistor Q2. The p-type region 226 is analogous to the second collector 18 of PNP transistor Q2. The n+ region 218 is analogous to the emitter of NPN transistor Q2.

The third p-type region 226 is connected to the n+ region 214 by metal, polysilicon or another subsequently formed conducting layer. This connection is shown by the dashed line 230 in FIG. 3. Forming this connection is analogous to tying the second collector 18 to the base 14 of PNP transistor Q1 (FIG. 1). In previous designs, the isolation region consisting of p-type region 226 was electrically coupled to the most negative potential in the circuit. As noted above, such previous designs exhibited unacceptably high levels of substrate current. The connection represented by dashed line 230 shorts the collector-base junction formed between n-type region 212 and p-type region 226, substantially reducing or eliminating substrate current.

The topology 210 does not include a resistor analogous to resistor 26 (FIG. 1). Such a resistor could be formed in a portion of the integrated circuit which includes the topology 210 adjacent to the topology 210. Similarly, the topology 210 does not include a zener diode analogous to zener diode 132 (FIGS. 2A, 2B, 2C), which could also be formed adjacent to topology 210.

As illustrated in FIG. 3, the second p-type region 224 which is analogous to the emitter of PNP transistor Q1 is substantially round. While this shape is preferred, other shapes such as square or rectangular provide satisfactory results.

The portion 232 of the n-type region 216 between the first p-type region 220 and the second p-type region 224 is analogous to the base region of PNP transistor Q1 (FIG. 1). The distance 234 between the first p-type region 220 and the second p-type region 224 defines the base width of the transistor corresponding to PNP transistor Q1. Transistor action occurs along an area 236 of the first p-type region 220 adjacent the second p-type region 224. By varying the shape of the first p-type region 220 to thereby vary this area 236, the holding current of the silicon controlled rectifier defined by the topology 210 may be varied.

Figure 4:
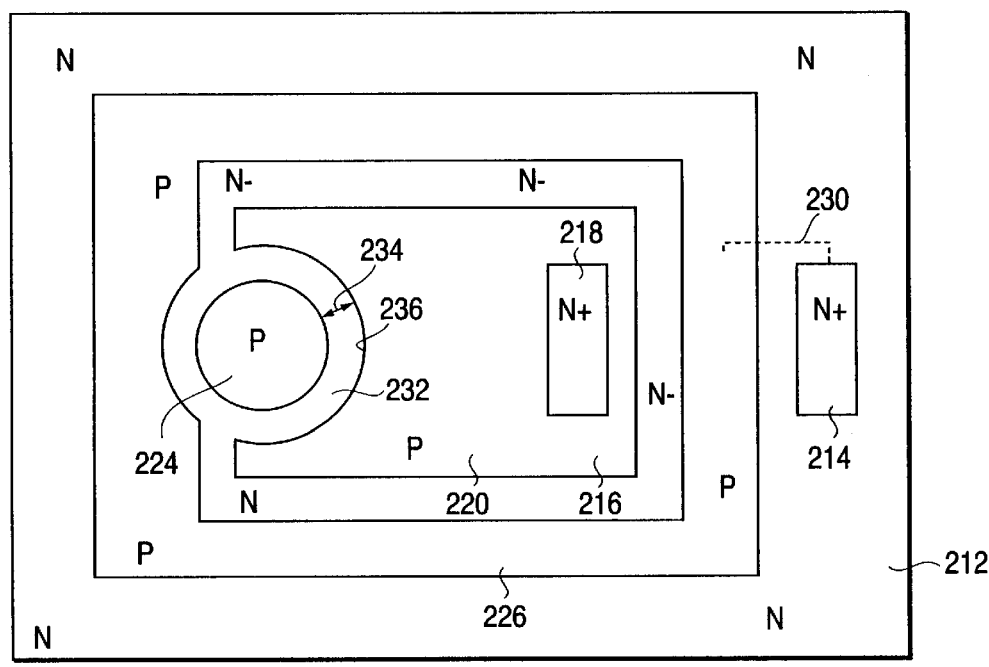
FIG. 4 illustrates a second topology for manufacturing the silicon controlled rectifier of FIG. 1.

FIG. 4 illustrates a second topology 310 for manufacturing the silicon controlled rectifier of FIG. 1. In FIG. 4, the regions of the topology 310 are preferably formed identically to the respective regions of the topology 210 of FIG. 3. Similarly, the regions of the topology 310 define elements of a silicon controlled rectifier analogous to silicon controlled rectifier 10 (FIG. 1) in the same way that the regions of the topology 210 (FIG. 3) define elements of a silicon controlled rectifier.

In the topology 310 illustrated in FIG. 4, the shape of the first p-type region 220 has been modified relative to the shape of the first p-type region 220 in the topology 210 (FIG. 3). In the topology 310, the area 236 of the first p-type region 220 adjacent the second p-type region 224 is greater. By varying the area 236 in this manner, the holding current of the silicon controlled rectifier formed by the topology 310 may be varied relative to the holding current of the silicon controlled rectifier formed by the topology 210.

Prior designs required an additional resistor between the anode A and the base 14 of the PNP transistor Q1 (FIG. 1) for variation of the holding current. Variation of the resistor value varied the holding current. Such a resistor was manufactured separately from the topology 310, in an adjacent area of the integrated circuit which includes the topology 310. By eliminating this resistor, the invention thus allows fabrication of a silicon controlled rectifier having variable holding current and having fewer elements than previous designs. The requirement of fewer elements reduces the physical size of such a silicon controlled rectifier, improving manufacturability, reducing manufacturing cost and improving reliability.

While the invention has been described with respect to the preferred physical embodiment constructed in accordance therewith, it will be apparent to those skilled in the art that various modifications and improvements may be made without departing from the scope and true spirit of the invention. Accordingly, it is to be understood that the invention is not to be limited by its specific illustrative embodiment, but only by the scope of the appended claims.

For example, the outer p-ring 226 may be formed using a deeper diffusion than inner p-rings (220, 224). The forming of the p-rings can be done is separate diffusion steps if different diffusions are desired, or they can be done in one diffusion step if the same diffusion is desired. One benefit of having a deeper diffusion in outer p-ring 226 is that it lowers the saturation resistance of the transistor. Having an outer p-ring 226 with a deeper diffusion also reduces the substrate current at high current levels.

What is claimed is:

1. A silicon controlled rectifier having an anode and a cathode and comprising:

an NPN transistor having an emitter coupled to the cathode, a base and a collector; and a PNP transistor having a base coupled to the NPN collector, an emitter coupled to the anode, a first collector coupled to the NPN base and a second collector coupled to the NPN collector.

2. A silicon controlled rectifier as recited in claim 1 wherein the silicon controlled rectifier includes an n-type layer forming the NPN collector; first, second and third p-type regions formed in the n-type layer, the first p-type region forming the first PNP collector and the NPN base, the second p-type region forming the PNP emitter, the third p-type region forming the second PNP collector; and an n-type region formed in the first p-type region, the n-type region forming the NPN emitter.

3. A silicon controlled rectifier as recited in claim 2 wherein the third p-type region surrounds the first and second p-type regions spaced a first predetermined distance from the first and second p-type regions by a first portion of the n-type layer, the first p-type region being spaced a second predetermined distance from the second p-type region by a second portion of the n-type layer.

4. A silicon controlled rectifier as recited in claim 3 wherein the first p-type region includes a first area adjacent the second p-type region and wherein the third p-type region includes a second area adjacent the second p-type region.

5. A silicon controlled rectifier as recited in claim 4 wherein the silicon controlled rectifier operates in one of a blocking state and a conducting state, the first PNP collector conducting a first collector current in the conducting state, the second PNP collector conducting a second collector current in the conducting state, and wherein the ratio of the first collector current to the second collector current is proportional to the ratio of the first area to the second area.

6. A silicon controlled rectifier as recited in claim 1 further comprising a resistor, the resistor having a first end coupled to the NPN base and a second end coupled to the cathode.

7. A silicon controlled rectifier as recited in claim 6 further comprising a gate, the second PNP collector, the NPN base and the first end of the resistor being coupled to the gate.

8. A silicon controlled rectifier as recited in claim 1 further comprising a zener diode, the zener diode having a cathode coupled to the silicon controlled rectifier anode and an anode coupled to the base of the NPN transistor.

9. A silicon controlled rectifier as recited in claim 1 further comprising a zener diode, the zener diode having a cathode coupled to the base of the PNP transistor and an anode coupled to the base of the NPN transistor.

10. A silicon controlled rectifier as recited in claim 1 further comprising a zener diode, the zener diode having a cathode coupled to the silicon controlled rectifier anode and an anode coupled to the base of the PNP transistor.

11. A silicon controlled rectifier as recited in claim 2, wherein the first p-type region is separate and distinct with respect to the third p-type region.

12. A silicon controlled rectifier as recited in claim 2, wherein the second p-type region has a circular-shaped top surface.

13. A silicon controlled rectifier as recited in claim 12, wherein the second n-type region includes a toroidal portion that encircles the second p-type region.

14. A silicon controlled rectifier as recited in claim 13, wherein the first p-type region has a substantially rectangular shape, and wherein the second n-type region also includes a substantially rectangular portion that borders the first p-type region on an outside thereof.

15. A silicon controlled rectifier as recited in claim 1, wherein the first collector is separately disposed and distinct from the second collector.

* * * * *